(12) United States Patent
Vanhoucke et al.

(10) Patent No.: US 8,803,156 B2
(45) Date of Patent: Aug. 12, 2014

(54) HETEROJUNCTION BIOPOLAR TRANSISTOR AND MANUFACTURING METHOD

(75) Inventors: Tony Vanhoucke, Bierbeek (BE); Johannes Josephus Theodorus Marinus Donkers, Valkenswaard (NL); Hans Mertens, Leuven (BE); Blandine Duriez, Brussels (BE); Evelyne Marie Josephe Fabienne Gridelet, Omal (BE)

(73) Assignee: NXP, B.V., Eindhoven (NL)

( * ) Notice: Subject to any disclaimer, the term of this patent is extended or adjusted under 35 U.S.C. 154(b) by 13 days.

(21) Appl. No.: 13/205,932

(22) Filed: Aug. 9, 2011

(65) Prior Publication Data

US 2012/0037914 A1   Feb. 16, 2012

(30) Foreign Application Priority Data

Aug. 10, 2010   (EP) .................... 10172433

(51) Int. Cl.
*H01L 29/00*   (2006.01)
*H01L 31/036*   (2006.01)

(52) U.S. Cl.
USPC .......................................... 257/65

(58) Field of Classification Search
CPC .................................................. H01L 29/737
USPC ............ 257/65, 51, 565, 592; 438/202, 361, 438/425
See application file for complete search history.

(56) References Cited

U.S. PATENT DOCUMENTS

| | | | |
|---|---|---|---|
| 5,504,018 A | 4/1996 | Sato | |
| 6,043,554 A | 3/2000 | Miwa | |
| 6,235,567 B1 * | 5/2001 | Huang | 438/202 |
| 6,239,477 B1 * | 5/2001 | Johnson | 257/592 |
| 7,074,685 B2 * | 7/2006 | Magnee et al. | 438/312 |
| 7,119,382 B2 * | 10/2006 | Sato et al. | 257/197 |
| 7,288,827 B2 * | 10/2007 | Chen et al. | 257/565 |
| 7,732,292 B2 * | 6/2010 | Khater et al. | 438/321 |
| 7,910,448 B2 * | 3/2011 | Meunier-Beillard et al. | 438/361 |
| 2005/0006724 A1 * | 1/2005 | Ehwald et al. | 257/588 |

(Continued)

FOREIGN PATENT DOCUMENTS

EP   0177246 A1   9/1986

OTHER PUBLICATIONS

Vizkelethy et al., "Ion beam induced charge (IBIC) studies of silicon germanium heterojunction bipolar transistors (HBTs)," Nuclear Instruments and Methods in Physics Research B 260 (2007) pp. 264-269.

(Continued)

*Primary Examiner* — Vongsavanh Sengdara
*Assistant Examiner* — Ismail Muse

(57) ABSTRACT

A method of manufacturing a heterojunction bipolar transistor, including providing a substrate comprising an active region bordered by shallow trench insulation regions; depositing a stack of a dielectric layer and a polysilicon layer over the substrate; forming a base window in the stack, the base window extending over the active region and part of the shallow trench insulation regions, the base window having a trench extending vertically between the active region and one of the shallow trench insulation regions; growing an epitaxial base material inside the base window; forming a spacer on the exposed side walls of the base material; and filling the base window with an emitter material. A HBT manufactured in this manner and an IC including such an HBT.

18 Claims, 5 Drawing Sheets

(56) References Cited

U.S. PATENT DOCUMENTS

Figure 1:
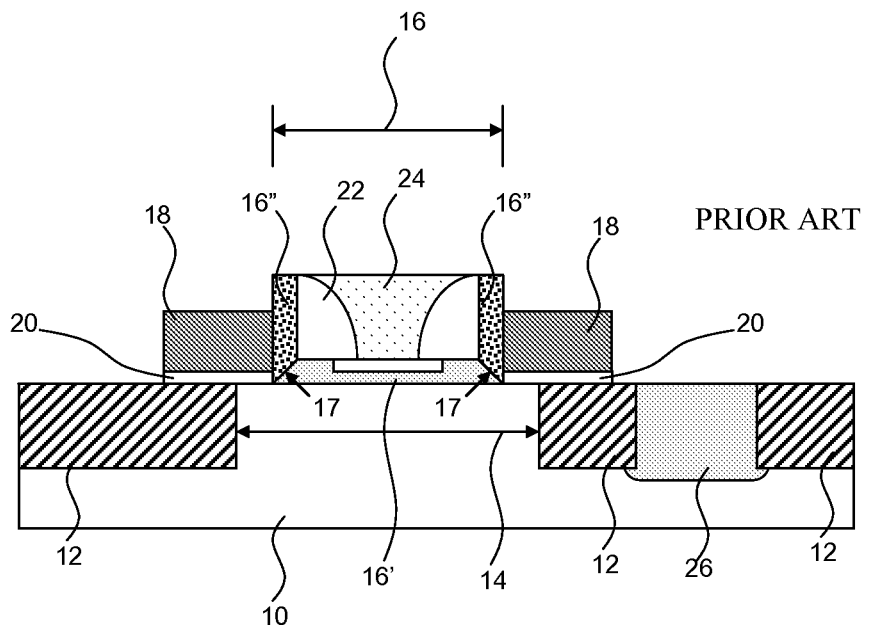

| | | | |
|---|---|---|---|
| 2005/0070076 A1* | 3/2005 | Dion ............................ | 438/478 |
| 2005/0079658 A1* | 4/2005 | Li et al. ........................ | 438/189 |
| 2006/0220064 A1* | 10/2006 | Joodaki et al. ................ | 257/197 |
| 2007/0222032 A1* | 9/2007 | Schaefer et al. .............. | 257/565 |
| 2007/0264787 A1* | 11/2007 | Dunn et al. ................... | 438/321 |
| 2009/0159982 A1* | 6/2009 | Yoon ............................. | 257/370 |
| 2009/0203184 A1* | 8/2009 | Magnee et al. ............... | 438/369 |
| 2010/0327280 A1* | 12/2010 | Joseph et al. ................. | 257/51 |
| 2012/0168908 A1 | 7/2012 | Vanhoucke et al. | |
| 2013/0214275 A1* | 8/2013 | Adkisson et al. ............. | 257/51 |

OTHER PUBLICATIONS

Extended European Search Report, application 101724334, EPO, Jan. 2011.

Knoll, D. et al. "A Low-Cost, High-Performance, High-Voltage Complementary BiCMOS Process," 2006 Int'l. Electron Devices Meeting, 4 pgs. (2006).

Knoll, D. et al. "A Flexible, Low-Cost, High Performance SiGe:C BiCMOS Process with a One-Mask HBT Module", 2002 Int'l. Electron Devices Meeting Digest, pp. 783-786 (2002).

* cited by examiner

HETEROJUNCTION BIOPOLAR TRANSISTOR AND MANUFACTURING METHOD

This application claims the priority under 35 U.S.C. §119 of European patent application no. 10172433.4, filed Aug. 10, 2010, the contents of which are incorporated by reference herein.

FIELD OF THE INVENTION

The present invention relates to a method of manufacturing a heterojunction bipolar transistor (HBT).

The present invention further relates to a HBT manufactured in accordance with this method.

BACKGROUND OF THE INVENTION

Nowadays, the vast majority of ICs are realized in complementary metal oxide on silicon (CMOS) technology, because of the high feature density that can be realized in this technology. The reduction in CMOS device feature size has further led to an improvement in the switching speeds of CMOS devices such that it has become feasible, at least in terms of switching speeds, to replace bipolar transistors in high-frequency components of ICs such as radio-frequency (RF) components with CMOS devices. This has the advantage that the number of process steps required for manufacturing the IC can be significantly reduced because it is no longer necessary to have two sets of processing steps for realizing components in different technologies.

However, the speed of the semiconductor device is not the only Figure of Merit (FoM) the designer has to deal with. Other parameters that are at least equally important include cut-off frequency and maximum frequency of oscillation (fT and fMAX), transconductance (gm), output conductance (go), matching, and 1/f noise and NF characteristics.

The required values of these performance parameters are not easily achieved with CMOS devices because the decrease in the feature size of CMOS devices has meant that their supply voltage has also been reduced for reliably operating the device and for reducing the power consumption of the IC. Consequently, the circuit design window has been significantly reduced, which introduces major design problems for e.g. power amplifiers or automotive circuits, for instance because the breakdown voltage of the CMOS devices is insufficient for high-voltage applications.

For analog applications, CMOS devices have been modified in many ways to achieve improved performance. Additional processing steps such as dual oxide technology and drain extensions have been introduced to increase the breakdown voltage of the devices, and additional implants, e.g. halo or pocket implants, have been proposed to counter the short channel effects and to control punch through. Such solutions have the drawback that they need additional process steps and/or additional masks, additional process development and qualification, leading to higher cost of the IC. In fact, in submicron CMOS technologies, cost has become a prohibitive factor in solely designing high-performance circuits in CMOS technology for e.g. radio frequency and analog mixed signal application domains. For this reason, mixed technology processes including both CMOS and bipolar transistors have already been used.

It is well known that vertical bipolar transistors are better suited for e.g. high voltage application domains than CMOS devices by virtue of a superior transconductance. Moreover, in a vertical bipolar transistor as suggested by its name, the main current flows vertically through the bulk as opposed to the lateral current flow through the channels of CMOS devices. This makes bipolar transistors much less sensitive to device degradation and allows for high power densities. Exploiting this vertical dimension can yield high breakdown voltages without requiring much extra silicon area compared to a corresponding CMOS device. In other words, bipolar transistors can be added to a CMOS design without significantly adding to the overall cost of the device to be manufactured.

An example of such a low-complexity HBT is shown in FIG. 1. The substrate 10 comprises an active window 14 separated by shallow trench insulations 12, which are typically formed of a suitable oxide. A collector region (not shown) is typically implanted under the active window 14 and is conductively coupled to the collector contact 26. The vertical heterojunction is defined by a base window 16 comprising an epitaxial base region including a monocrystalline portion 16' and a polycrystalline portion 16". The transition between these portions is defined by the grain boundary 17. Extrinsic base contacts for contacting the polycrystalline base material 16" are formed by polysilicon (poly-Si) regions 18 that are isolated from the substrate 10 by gate dielectric 20. The polysilicon regions 18 and gate dielectric 20 may be formed using a CMOS process steps to form the poly-Si gates of the MOS transistors. A poly-Si emitter 24 is located over the base region and electrically insulated from the extrinsic base region 16" by spacers 22. The emitter 24 typically has an outdiffusion region extending into the base region, which is formed when developing the emitter implant.

Figure 2:
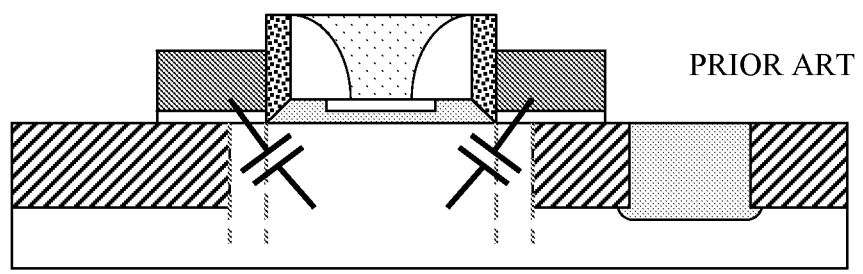

The base window 16 and active window 14 are typically not aligned with each other due to the fact that these windows are defined using different masks. In FIG. 1, the active window 14 is larger than the base window 16. Consequently, the location of the grain boundary 17 is determined by the gate oxide 20, as this is an amorphous material inducing polycrystalline epitaxial growth as opposed to the monocrystalline active substrate material inducing monocrystalline epitaxial growth. A drawback of this arrangement is that the overlap between the base contact and the active region causes a significant increase of the base-collector capacitance as indicated in FIG. 2. This capacitance limits the maximum oscillation frequency $f_{max}$ of the bipolar transistor, which is an important figure-of-merit for high-performance RF transistors. Hence, this overlap is undesirable.

Figure 3:
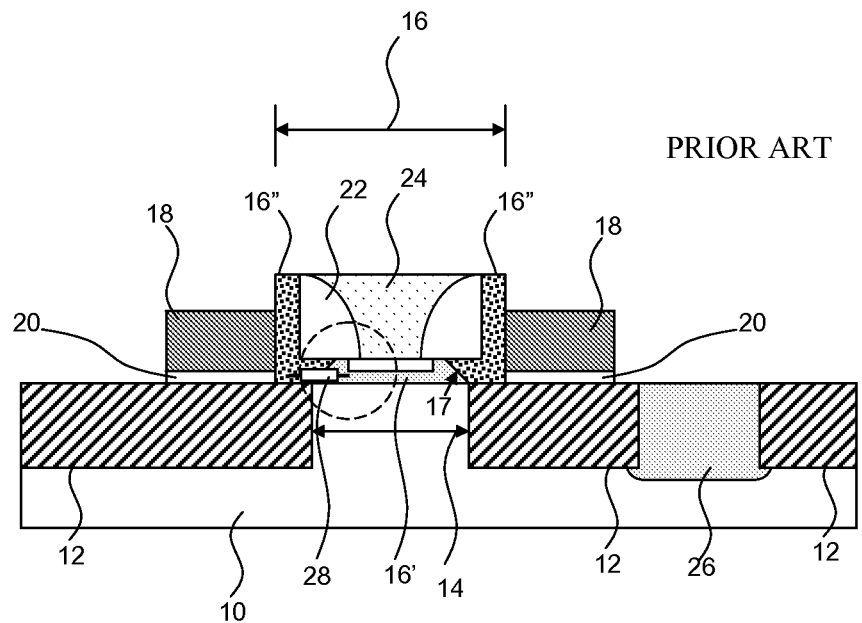

This overlap can be avoided by choosing the base window 16 to be larger than the active window 14, as shown in FIG. 3. This results in the grain boundary 17 to be located closer to the emitter outdiffusion as its location is determined by the polycrystalline epitaxial growth from the STI region 12 bordering the monocrystalline active window 14. It therefore appears that the base-collector capacitance $C_{CB}$ can be simply reduced by choosing the active window 14 to be smaller than the base window 16. Unfortunately, $f_{max}$ is inversely proportional to $\sqrt{C_{CB}R_B}$, in which $R_B$ is the base resistance. As the base resistance is increased by choosing the base window 16 to be larger than the active window 14, simply extending the base window 16 does not guarantee an improvement in $f_{max}$. Moreover, a substantial base resistance increases noise levels of a bipolar transistor, and is therefore also undesirable.

Figure 4:
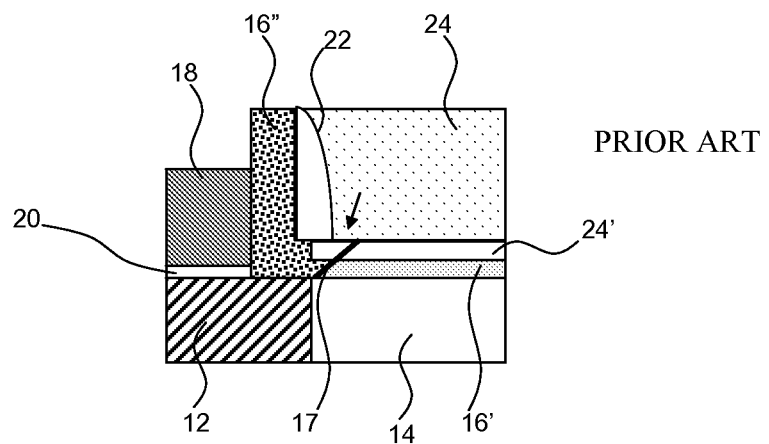

A dominant component to the total base resistance is the link resistance 28, which is located under the emitter-base spacer shown in FIG. 3. A reduction in base resistance may therefore be achieved by reducing the link resistance 28. This may for instance be achieved by reducing the width of the spacers 22. Although this is technologically straightforward, the lower limit of such a width reduction is dictated by the fact that the grain boundary 17 should not be in contact with the emitter outdiffusion 24' as shown in FIG. 4, as it is well-known that this causes emitter-base junction leakage, which destroys the bipolar transistor. In other words, the width of the spacers 22 is not dictated by technological limits but by the position of the grain boundary 17 instead.

SUMMARY OF THE INVENTION

The present invention seeks to provide a method of manufacturing a HBT having an improved maximum oscillation frequency.

The present invention further seeks to provide a HBT having an improved maximum oscillation frequency.

In accordance with a first aspect of the present invention, there is provided method of manufacturing a heterojunction bipolar transistor, comprising providing a substrate comprising an active region bordered by shallow trench insulation regions; depositing a stack of a dielectric layer and a polysilicon layer over the substrate; forming a base window in said stack extending over the active region and part of the shallow trench insulation regions, said base window comprising a trench extending vertically between the active region and one of said shallow trench insulation regions; growing an epitaxial base material over the resultant structure; forming a spacer on the exposed side walls of the base material; and filling the remainder of the base window with an emitter material.

The formation of the vertical trench and lining the base window including the vertical trench with an epitaxial seed liner ensures that the grain boundary is angled towards the side walls of the base window, i.e. is angled away from an outdiffusion region of the emitter. Consequently, the base link resistance can be significantly reduced due to the fact that much smaller spacers can be used for separating the extrinsic base from the emitter. As a result, a lower base resistance $R_B$, a lower noise figure and a higher $f_{max}$ can be simultaneously achieved without risking emitter-base junction leakage.

In an embodiment, an epitaxial seed layer may be formed over the structure resulting after base window formation to promote the nucleation of the epitaxial base material. This seed layer may be omitted if the epitaxial base material nucleates sufficiently well on the exposed surfaces of the aforementioned resulting structure.

In an embodiment, a capping layer may be formed over the epitaxial base material prior to spacer and emitter formation. The epitaxial seed layer, epitaxial base layer and capping layer may thus form a layer stack.

In an embodiment, the step of forming the base window in said stack comprises etching the base window using the dielectric layer as an etch stop layer; removing the dielectric layer inside the base window; and exposing the base window to a selective oxide etch to form said trench. This has the advantage that the trench can be formed reusing the base window mask, thus reducing the cost of the HBT. The dielectric layer is preferably removed in the same selective oxide etch step, thus further reducing manufacturing time and cost.

Preferably, the method further comprises annealing the structure resulting after base window formation in a hydrogen gas atmosphere prior to growing said epitaxial seed layer. This causes a rounding of the side wall edge of the vertical trench formed by the active region, which has the advantage that crystal defects are avoided and a better quality monocrystalline seed layer growth is realized.

According to another aspect of the present invention, there is provided a heterojunction bipolar transistor comprising a substrate comprising an active region bordered by shallow trench insulation regions, a base region extending over the active region, said base region comprising trench extending into the substrate between the active region and one of said shallow trench insulation regions; an emitter region formed on the base region; and a base contact laterally displaced with respect to the emitter region and separated from said emitter region by a spacer, wherein the base region comprises an epitaxial layer having a grain boundary between a monocrystalline region and an amorphous region in said trench.

This HBT, which may be manufactured by the method of the present invention, benefits from a lower link resistance, a lower base resistance $R_B$, a lower noise figure and a higher $f_{max}$ compared to prior art HBTs such as the HBT shown in FIG. 1.

In an embodiment, the epitaxial layer comprises a Si/SiGe:C/Si layer stack, which is a material combination known to provide good epitaxial growth whilst the Si layers prohibit the contamination of neighboring materials with the carbon from the SiGe:C material.

In another embodiment, the emitter region comprises polycrystalline silicon, as this can be grown using CMOS-compatible deposition techniques.

The HBT of the present invention may be advantageously integrated in an integrated circuit such as an integrated circuit wherein the heterojunction bipolar transistor is located in a first region of heterojunction bipolar transistors, with the integrated circuit further comprising a second region of complementary metal oxide semiconductor transistors, said second region bordering said first region. Such mixed CMOS/bipolar ICs benefit from improved RF and analog performance due to the integration of the HBT of the present invention.

BRIEF DESCRIPTION OF THE EMBODIMENTS

Figure 5:
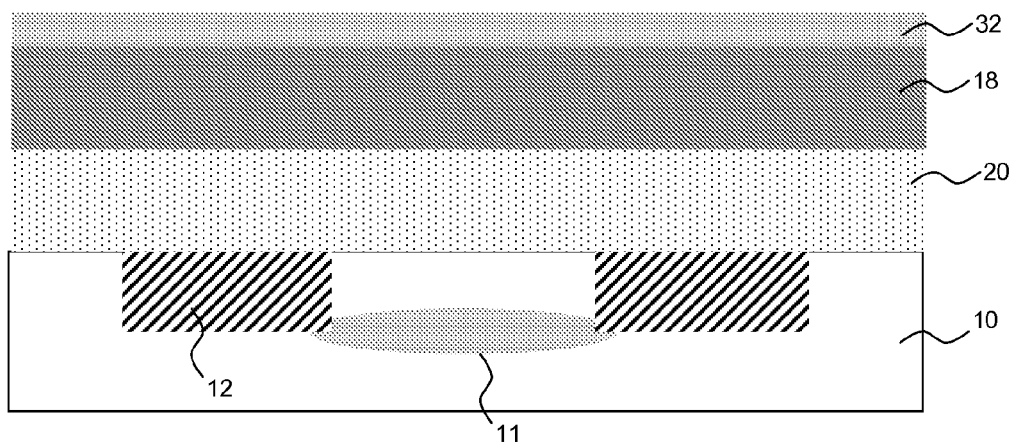
Figure 6:
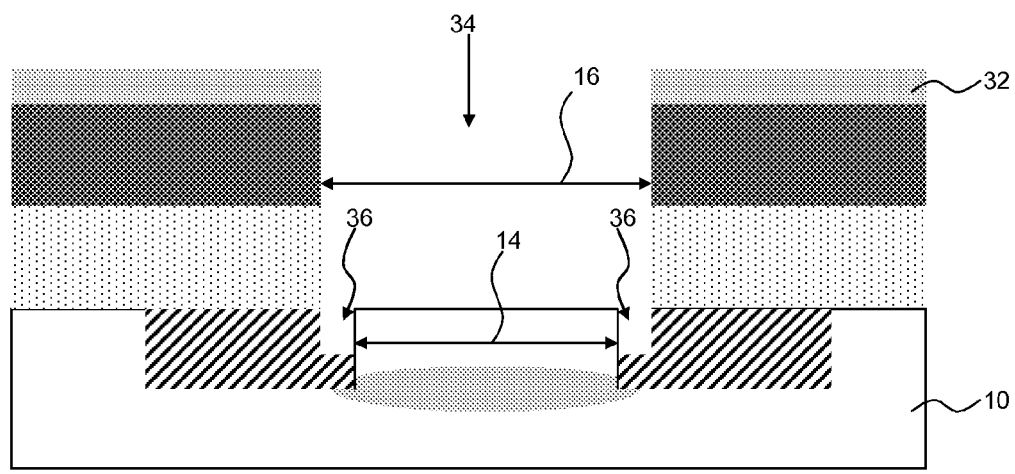
Figure 7:
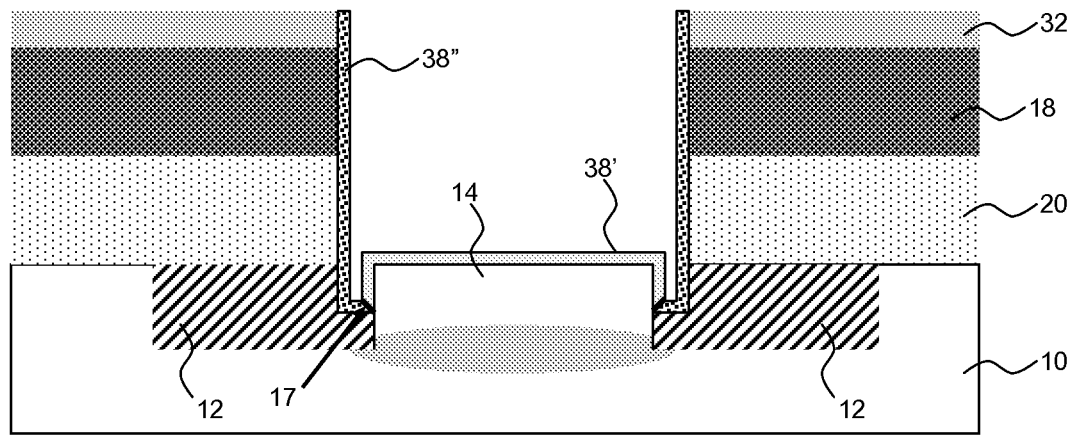
Figure 8:
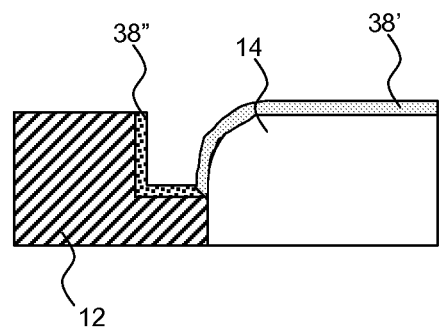
Figure 9:
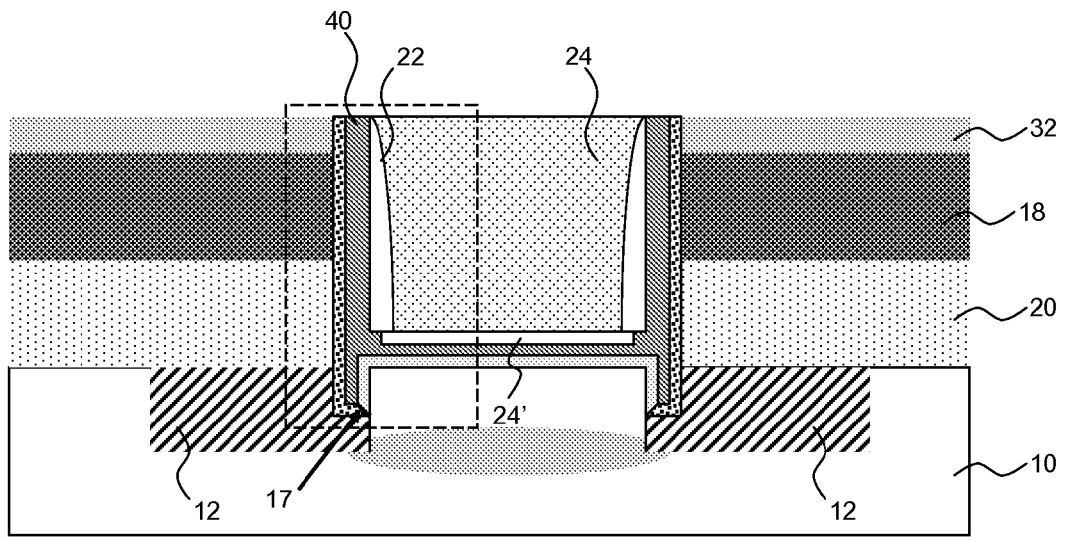
Figure 10:
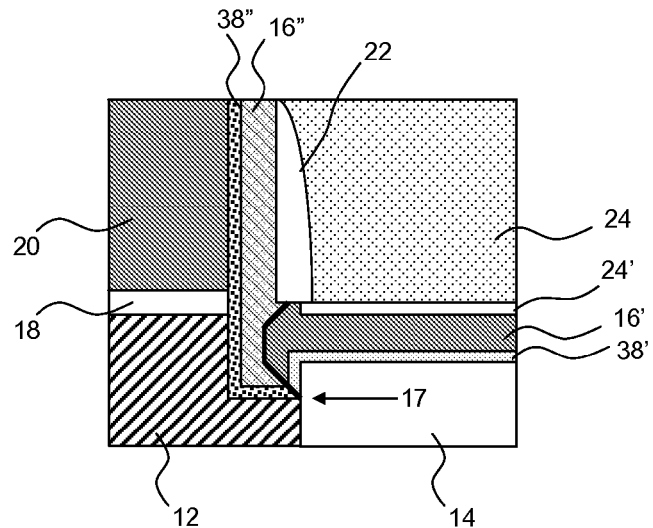

Embodiments of the invention are described in more detail and by way of non-limiting examples with reference to the accompanying drawings, wherein:

FIG. 1 schematically depicts a prior art HBT;

FIG. 2 schematically depicts an aspect of the HBT of FIG. 1;

FIG. 3 schematically depicts another prior art HBT;

FIG. 4 schematically depicts a potential problem associated with the HBT of FIG. 3;

FIG. 5-7 schematically depict various steps of an embodiment of the present invention;

FIG. 8 schematically depicts a step of an alternative embodiment of the method of the present invention;

FIG. 9 schematically depicts various steps of an embodiment of the present invention leading to a HBT of the present invention; and FIG. 10 schematically depicts an aspect of the HBT of FIG. 9.

DETAILED DESCRIPTION OF THE DRAWINGS

It should be understood that the Figures are merely schematic and are not drawn to scale. It should also be understood that the same reference numerals are used throughout the Figures to indicate the same or similar parts.

In FIG. 5, a substrate 10 is provided which comprises STI regions 12 and a collector implant 11. The STI regions 12 may be formed in any suitable manner, e.g. by forming a trench and filling the trench with a suitable oxide, e.g. $SiO_2$. The STI regions 12 may also be replaced by other suitable solutions for isolating the HBT in the substrate 10. It is important that the upper surface of the substrate 10 comprises mono-crystalline silicon, the reason for which will be explained in more detail later. Hence, the substrate 10 may be a mono-crystalline silicon substrate or may comprise an upper layer of epitaxial silicon (not shown). For the sake of completeness, it is pointed out that mono-crystalline silicon, which is sometimes also referred to as a single crystal, comprises a crystal lattice having a single orientation, as opposed to poly-crystalline silicon, which lattice has multiple orientations, i.e. is more amorphous.

A dielectric layer 20 acting as an etch stop layer may be formed over the substrate 10. A suitable candidate material for the etch stop layer 20 is a gate oxide layer although other materials may also be considered. A polysilicon layer 18 is subsequently grown, which may be covered by a sacrificial layer 32. The polysilicon layer is sometimes also referred to as the poly-Si gate. The sacrificial layer 32 may be used at a later stage as a stop layer for a chemical mechanical polishing (CMP) step. The sacrificial layer 32 may be a dielectric layer such as a nitride layer.

It should be appreciated that FIG. 5 only depicts a part of the HBT to be formed. The substrate 10 typically further comprises a collector contact implant such as the collector implant 26 shown in FIG. 1, which may be realized in any suitable manner. The substrate 10 may further comprise a separate region in which CMOS devices, e.g. pMOS and/or nMOS transistors have been formed or are to be formed. As these different options are well-known per se and not relevant to the present invention, they have not been described in detail for the sake of brevity.

In a next step, shown in FIG. 6, the base window 16 is opened by a suitable etch recipe, thereby forming base window trench 34. As many suitable etch recipes for etching poly-Si and nitride layers are well-known, they will not be recited explicitly for the sake of brevity. The base window etch is terminated on the oxide etch stop layer 20, e.g. a gate oxide layer. It is essential that the base window 16 is larger than the active window 14, i.e. that the base window 16 extends over the active window 14 and part of the STI trenches 12 bordering the active window 14. This will be explained in more detail below.

Following the formation of the base window trench 34, the resultant structure is subjected to a selective oxide etch, which removes the oxide etch stop layer 20 over the active window 14 and forms a trench 36 in the exposed parts of the STI regions 12. It is important that the etch recipe is selective to oxide as the silicon active window 14 should not be attacked by the etch recipe. As such selective oxide-etch recipes are known per se, they will not be further discussed for the sake of brevity.

It is noted that the trench 36 formed in this manner is self-aligned with the base window 16. The trench 36 is formed by the removal of the STI oxide 12 between the vertical boundary of the active window 14 and the vertical boundary of the base window 16 extending into the STI oxide 12. Consequently, the vertical sidewalls of the trench 36 are bordered by the active window 14 on one side and the STI region 12 on the other side, with the bottom of the trench formed by a remaining portion of the STI oxide. The latter is important to ensure that the grain boundary 17 is directed towards the sidewalls of the base window 16, as will be explained in more detail below.

In a next step, an epitaxial seed layer is grown over the resultant structure, at least inside the base window 16. This is shown in FIG. 7. This seed layer will form as a monocrystalline layer portion 38' on a monocrystalline surface, in this case the exposed surfaces of the monocrystalline silicon active window 14, whereas the seed layer will form as either a polycrystalline or amorphous layer portion 38" respectively on polycrystalline or amorphous surfaces, in this case the exposed surfaces of the STI regions 12, oxide etch stop layer 20, poly-Si 18 and sacrificial layer 32. The seed layer is typically used to promote the growth of an epitaxial SiGe:C layer, which is known to nucleate (seed) poorly on polycrystalline oxide surfaces such as the STI oxide. In an embodiment, the seed layer is an epitaxially grown silicon layer. In case a better nucleating base material is used, the seed layer may be omitted.

Importantly, the grain boundary 17 between the monocrystalline layer portion 38' and the polycrystalline or amorphous layer portion 38" is formed at the junction between the amorphous STI regions 12 and the monocrystalline active window 14. This has the consequence that the grain boundary 17 in the epitaxial seed layer extends outwardly from this junction towards the side walls of the trench 34 as opposed to the inwardly extending grain boundary 17 in the HBT in FIGS. 1 and 3. In other words, the grain boundary 17 of the HBT of the present invention is directed away from an emitter outdiffusion region 24', as will be shown in more detail later.

At this point, it is noted that in FIG. 7, the upper corner of the trench 32 with the upper surface of the active window 14 is more or less rectangular, i.e. is a sharp edge. This may not be preferable in case such a sharp edge induces the formation of defects in the monocrystalline layer portion 38' whilst growing the epitaxial layer portion, for instance because of crystal lattice defects in the monocrystalline silicon of the active window 14. It may therefore be advantageous to expose the active window 14 to an anneal step in a hydrogen gas ($H_2$) atmosphere prior to growing the epitaxial seed layer. It is known that such an anneal step can smooth a (monocrystalline) silicon surface, resulting in a rounding of the aforementioned corners of the trench 36. This is shown in FIG. 8, which depicts the relevant part of the resultant structure after hydrogen anneal and subsequent epitaxial seed layer growth.

From this point, the manufacture of the HBT may be completed using process steps that are known per se, such as by growing an epitaxial base layer 40 on the epitaxial seed layer and formation of spacers 22 on the sidewalls of the epitaxial base layer resultant structure prior to emitter deposition in the remainder of the trench 34. The epitaxial base layer 40 may be any suitable material, preferably a Si/SiGe:C/Si layer stack, which may be doped with a suitable impurity. The emitter 24 may be formed by depositing and subsequently doping poly-Si with a suitable impurity, followed by the activation of the impurity leading to the formation of the outdiffusion region 24' in the epitaxial base layer 40 as shown in FIG. 9.

Prior to the formation of the emitter 24, a capping layer may be formed over the epitaxial base layer. This capping layer, which may comprise the same impurity type of the epitaxial base layer 40, typically is tuned to a thickness close to the outdiffusion of the emitter 24, i.e. the outdiffusion of the impurities in the emitter material, which typically are of an opposite type as the impurities in the base and capping layer. For instance, the base and capping layers may be doped with p-type boron, and the emitter material may be doped with n-type arsenic.

FIG. 10 shows a magnification of the dashed region of the HBT depicted in FIG. 9. It can be seen that where the epitaxial base layer 40 is grown on the polycrystalline seed layer portion 38", a polycrystalline base layer portion 16" is obtained, whereas where the epitaxial base layer 40 is grown on the monocrystalline seed layer portion 38', a monocrystalline base layer portion 16" is obtained. It is schematically shown in FIG. 10 that the grain boundary 17 at some point diverts away from the vertical side wall covered by the polycrystalline seed layer portion 38". This is caused by the fact that the polycrystalline base layer portion 16" and monocrystalline base layer portion 16" grow at similar rates, such that the resulting thicknesses of these layer portions on either side of the grain boundary 17 is comparable. It is noted that the growth rates between the polycrystalline portion 16" and the mono-crystalline portion 16' can be influenced by altering process conditions such as pressure and temperature. Typically, the polycrystalline portion 16" grows 10-20% faster than the monocrystalline portion 16'.

However, the amount of inward tapering of the grain boundary 17 is significantly less than in the prior art HBTs shown in FIGS. 1 and 3, such that the effective width or thickness of the spacers 22 in the HBT of the present invention can be significantly reduced without the risk that the grain boundary 17 extends into the emitter outdiffusion region 24'. As previously explained, the smaller spacer width dimensions result in a reduction of the base resistance, thereby especially improving the high-frequency performance of the HBT of the present invention.

At this point, it is noted that in the HBT of the present invention, the STI trench 36 may add some peripheral collector-base capacitance compared to prior art approaches, such as shown in FIG. 3. This collector-base capacitance is proportional to the depth of the trench 36. This is however fully compensated by the fact that the collector-base capacitance under the spacers 22 is significantly reduced when reducing spacer width. Consequently, the total collector-base capacitance value for the HBT of the present invention is expected to be very similar to prior art values.

In fact, process optimization can result in very shallow STI trenches 36 to minimize the added capacitance while keeping the full benefit of spacer width reduction. Furthermore, as noise is the most critical figure-of-merit in many low-noise high-performance mixed-signal applications, the significant reduction in the base resistance whilst not (significantly) affecting $C_{CB}$, the noise levels of the HBT of the present invention are significantly reduced, as previously explained.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A heterojunction bipolar transistor comprising:
    a substrate including an active region in the substrate laterally bordered by shallow trench insulation regions;
    a base region extending vertically above at least a portion of the active region;
    a base window trench, having sidewalls, extending vertically above the active region and extending laterally between the shallow trench insulation regions;
    an epitaxial seed layer having a monocrystalline portion and a polycrystalline or amorphous portion;
    an emitter region formed on the base region;
    a grain boundary of the monocrystalline portion and the polycrystalline or amorphous portion at a junction between the shallow trench insulation regions and the active region, the grain boundary extending outwardly away from the emitter region toward the sidewalls of the base window trench; and
    a base contact laterally displaced with respect to the emitter region and separated from said emitter region by a spacer.

2. A heterojunction bipolar transistor comprising:
    a substrate including an active region in the substrate bordered by at least one shallow trench insulation region;
    a base region extending vertically above at least a portion of the active region;
    a base window trench, having sidewalls, extending laterally beyond the active region and vertically to the active region;
    at least one STI trench extending laterally between the active region and at least one of said shallow trench insulation regions, and extending into at least a portion of at least one of said shallow trench insulation regions;
    an emitter region formed on the base region;
    a grain boundary of the monocrystalline portion and a polycrystalline or amorphous portion in the at least one STI trench and at a junction between the shallow trench insulation regions and the active region, the grain boundary extending outwardly away from the emitter region toward the sidewalls of the base window trench; and
    a base contact laterally displaced with respect to the emitter region and separated from said emitter region by a spacer.

3. The heterojunction bipolar transistor of claim 1, wherein the active region includes upper edges that are adjacent to said trench and which have rounded corners.

4. The heterojunction bipolar transistor of claim 1, wherein the base region includes STI trenches at least partially formed in the shallow trench insulation regions.

5. The heterojunction bipolar transistor of claim 4, wherein the epitaxial layer comprises a Si/SiGe:C/Si layer stack, STI trenches include vertical sidewalls bordered laterally by the active region and the shallow trench insulation regions.

6. The heterojunction bipolar transistor of claim 1, wherein the emitter region comprises polycrystalline silicon.

7. The heterojunction bipolar transistor of claim 4, further comprising an epitaxial seed layer between the substrate and the epitaxial layer.

8. The heterojunction bipolar transistor of claim 4, further comprising a capping layer between the epitaxial layer and the emitter, said spacer being formed on the capping layer.

9. An integrated circuit comprising the heterojunction bipolar transistor of claim 1.

10. The integrated circuit of claim 9, wherein the heterojunction bipolar transistor is located in a first region of heterojunction bipolar transistors, the integrated circuit further comprising a second region of complementary metal oxide semiconductor transistors, said second region bordering said first region.

11. The heterojunction bipolar transistor of claim 2, wherein the active region includes upper edges that are adjacent to said STI trench and which have rounded corners.

12. The heterojunction bipolar transistor of claim 2, wherein the STI trenches include vertical sidewalls bordered laterally by the active region and the shallow trench insulation regions.

13. The heterojunction bipolar transistor of claim 12, wherein the epitaxial layer comprises a Si/SiGe:C/Si layer stack.

14. The heterojunction bipolar transistor of claim 2, wherein the emitter region comprises polycrystalline silicon.

15. The heterojunction bipolar transistor of claim 12, further comprising an epitaxial seed layer between the substrate and the epitaxial layer.

16. The heterojunction bipolar transistor of claim 12, further comprising a capping layer between the epitaxial layer and the emitter, said spacer being formed on the capping layer.

17. An integrated circuit comprising the heterojunction bipolar transistor of claim 2.

18. The integrated circuit of claim 17, wherein the heterojunction bipolar transistor is located in a first region of heterojunction bipolar transistors, the integrated circuit further comprising a second region of complementary metal oxide semiconductor transistors, said second region bordering said first region.

\* \* \* \* \*